Figure 1:
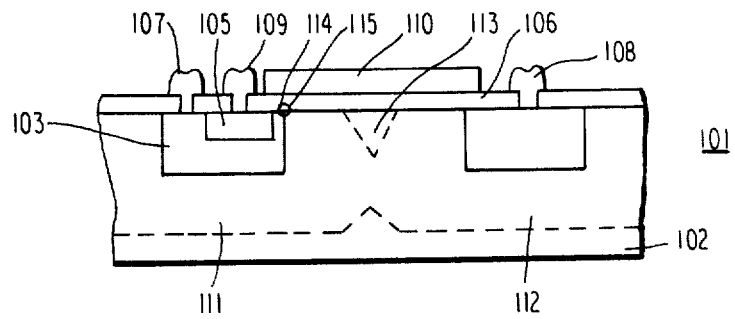

United States Patent [19]

Hamano et al.

[11] 4,298,962
[45] Nov. 3, 1981

[54] MEMORY

[75] Inventors: Kuniyuki Hamano; Toshiyuki Ohta, both of Tokyo, Japan

[73] Assignee: Nippon Electric Co., Ltd., Tokyo, Japan

[21] Appl. No.: 115,323

[22] Filed: Jan. 25, 1980

[30] Foreign Application Priority Data

Jan. 25, 1979 [JP] Japan .................................. 54-7988
Feb. 28, 1979 [JP] Japan .................................. 54-22695

[51] Int. Cl.³ .................................................. G11C 11/40
[52] U.S. Cl. ...................................... 365/182; 357/23; 365/186
[58] Field of Search ................... 365/182, 186; 357/23

[56] References Cited

U.S. PATENT DOCUMENTS 3,718,916  2/1973  Wada et al. ......................... 365/182
4,164,751  8/1979  Tasch ................................... 365/186
4,184,085  1/1980  Takahashi ........................... 365/186

Primary Examiner—Stuart N. Hecker
Attorney, Agent, or Firm—Sughrue, Mion, Zinn, Macpeak and Seas

[57] ABSTRACT

A high-density of semiconductor device is disclosed, which comprises a semiconductor substrate of a first conductivity type, first and second semiconductor regions of a second conductivity provided in the semiconductor substrate, the first and second semiconductor regions defining a channel region therebetween at the surface of the substrate, an insulator film disposed on the channel region, a conductive layer formed on the insulator film, means for producing depletion layers from the first and second semiconductor regions in such a manner that the depletion layers contact with each other to isolate the channel region from the substrate, means for selectively feeding majority carriers of the substrate to the channel region at a density higher than that of the substrate, and a means for detecting the existence of the accumulation of the majority carriers in the channel region.

8 Claims, 24 Drawing Figures

U.S. Patent   Nov. 3, 1981   Sheet 3 of 6   4,298,962

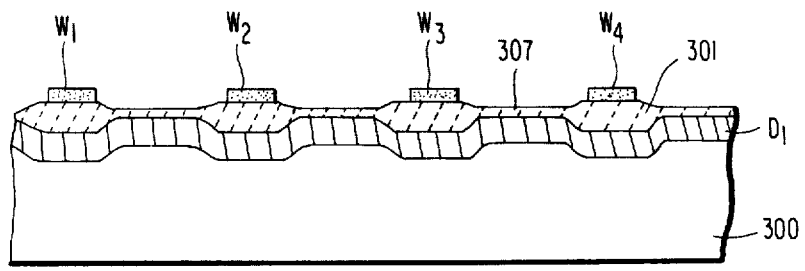
FIG. IIA
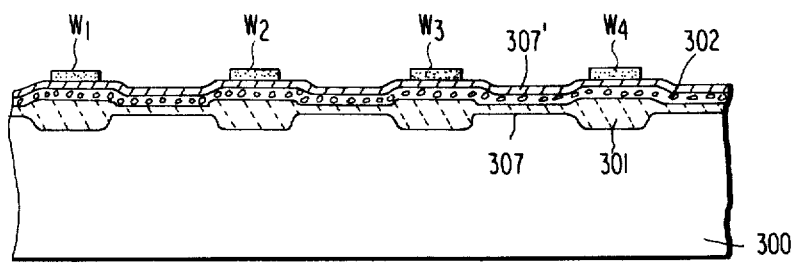
FIG. IIB
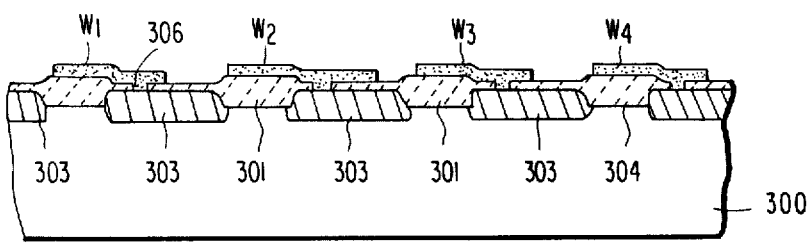
FIG. IIC
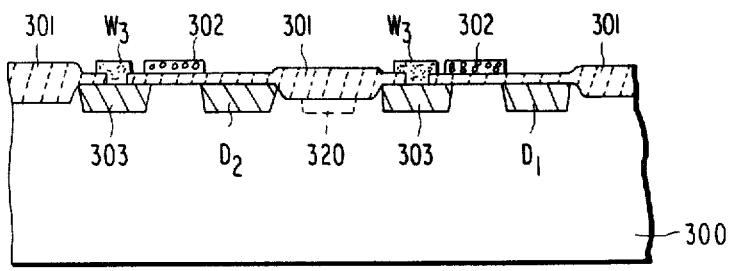
FIG. IID

MEMORY

The present invention relates to memories, and more particularly to semiconductor memories that can be realized in the form of an integrated circuit.

At present, the so-called one-transistor memory in which a memory cell consists of a single transfer-gate transistor and a single capacitor is widely utilized as a random access memory (RAM) having the largest integration density on a semiconductor chip. In such a one transistor memory, a metal-insulator-semiconductor (MIS) structure is employed to form the transfer-gate transistor and the capacitor.

In this type of memory, whether an electric charge is stored in the capacitor or not is made to correspond to the information of either "0" or "1". In order to hold the state of either "0" or "1" a voltage corresponding to that state is periodically applied to the MIS capacitor to perform refresh operation, since the charges stored in the capacitor tend to be leaked out. The state of charge storage or non-storage in the capacitor can be changed and established in an extremely short time period. In such a prior art RAM, a signal read out on a bit line is detected as a potential charge $\Delta V$ on the bit line caused by the capacitive division of the charge stored in the MIS capacitor between the bit line capacitance and the MIS capacitor. Where the bit line capacitance has no charge, the change $\Delta V$ in voltage of the bit line is larger when a charge is stored in the MIS capacitor than when a charge is not stored, so that the states of "0" can be distinguished. However, the prior art RAM has a big disadvantage, based on the fact that the electric charge used for causing the potential change in the bit line is only the charge which has been stored in the MIS capacitor. If the capacitance of this MIS capacitor is too small as compared to the capacitance of the bit line, then the potential change $\Delta V$ appearing on the bit line upon read-out would be indetectably small. While, if it is intended to increase the capacitance of the MIS capacitor to increase the potential change $\Delta V$, then it is necessary to enlarge the area of the MIS capacitor, to reduce the thickness of the gate insulating film, or to increase the capacitance per unit area by employing a material having a large dielectric constant as the gate insulating film. However, enlargement of the area of the MIS capacitor will result in wide lowering of the degree of circuit integration, and if the gate insulating film is made thin, the withstand voltage of the gate insulating film is lowered, resulting in damage of a large amount of MIS capacitors. Furthermore, if alumina or silicon nitride having a large dielectric constant is used for the insulating film, there occurs a problem in the stability of the electric performance of the MIS capacitor. As described above, the increase in the capacitance of the MIS capacitor is, in any event, accompanied by various disadvantages.

Therefore, it is one object of the present invention to provide a memory in which reading of information can be achieved with high stability.

Another object of the present invention is to provide an integrated memory circuit in which a high degree of circuit integration can be achieved.

The memory according to the present invention comprises a semiconductor substrate of one conductivity type, first and second regions of the opposite conductivity type provided in the semiconductor substrate, a channel region between the first and second regions, an insulating film on the channel region, a control electrode provided on the channel region, means for producing a depletion layer extending from the first region towards the second region, means for producing a depletion layer extending from the second region towards the first region, and means coupled to the control electrode for inducing excessive majority carriers to a portion of the channel region at the surface of the channel region to make the density of majority carriers in that portion higher than that in the semiconductor substrate. The excessive majority carriers are retained, or stored, in the induced portion except which the depletion layer extends into the channel region, and existence or non-existence of the excessive majority carriers corresponds to the information stored in the memory cell. The existence or non-existence can be detected by the value of the current flowing between the first and second regions. More particularly, when the excessive majority carriers exist in the channel region, a punch-through current is suppressed, while when the excessive majority carriers do not exist, the punch-through current is generated between the first and second region. The first and second regions are coupled respectively to a word line and a digit line.

The fabrication of the memory cell of the present invention can be realized by the well-known technique to form a usual insulated-gate field effect transistor (IGFET), wherein the first and second regions of the memory cell correspond to a source and a drain of IGFET and the control electrode to a gate electrode of IGFET. It is favorable for the purpose of retaining the excessive majority carriers to form one of the first and second regions in a ring-shaped pattern surrounding the other and the other in an island pattern disposed within the ring-shaped pattern. In this case the aforementioned control electrode takes a ring-shaped configuration covering the ring-shaped channel region between the two regions.

According to the present invention, an advantage is attained that a capacitor to be used for storing a large amount of electric charges, such as the prior art MIS memory capacitor, is unnecessary, because storage of information is effected by either accumulating or depleting the majority carriers of the substrate in the channel region and on the other hand reading of the stored information is effected by the current flowing between the first and second regions which correspond to the source and the drain of the MIS transistor. In other words, the memory cells can be made small, so that it is possible to realize a high degree of circuit integration. Also a further advantage is attained that since the read current can be chosen to be large, even if the bit line capacitance is large, it is possible to make a sufficiently large potential change arise on the bit line, so that detection of the read signal becomes very easy. Therefore, the memory cell of this invention is suitable for a large-capacity memory.

In the memory according to the present invention, by extending depletion layers from the first and second regions to the channel region, a pocket region defined by the depletion layers can be formed in the vicinity of the surface of the channel region. Information is stored by accumulating the majority carriers in this pocket region or depleting the majority carriers. Upon reading, assuming that the majority carriers are not accumulated in the pocket regions, when a voltage is applied to one of the first and second regions (a backward voltage), the depletion layer extending from this region applied with the voltage would further extend largely towards the other region until it reaches the other region, and thereby the so-called punch-through current flows. This punch-through current is caused by injection of minority carriers from the other region. On the contrary, if the majority carriers are accumulated in the pocket region, then the punch-through current would not arise or would arise only a little. As described above, according to the present invention, the existenc of the excessive majority carriers in the pocket region is detected in punch-through mode, and therefore reading can be achieved at a high speed.

According to the present invention, as a source of the majority carriers the substrate may be used. Instead, a region of one conductivity type may be formed within one of the first and second regions so that the majority carriers may be supplied therefrom.

Figure 2:
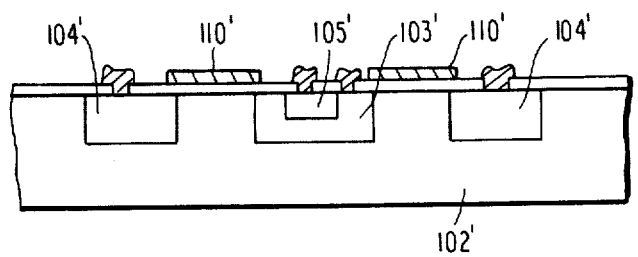
Figure 3:
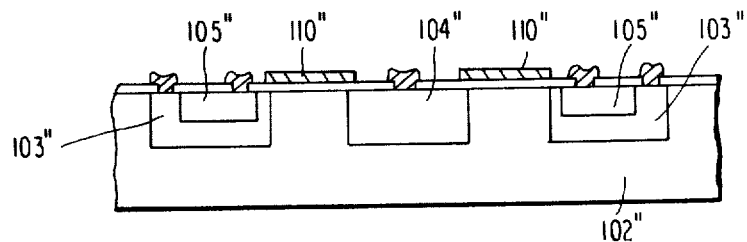
Figure 4:
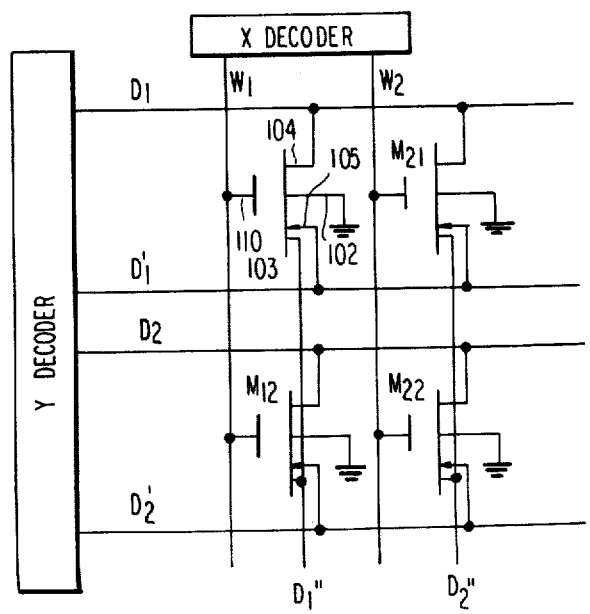
Figure 5:
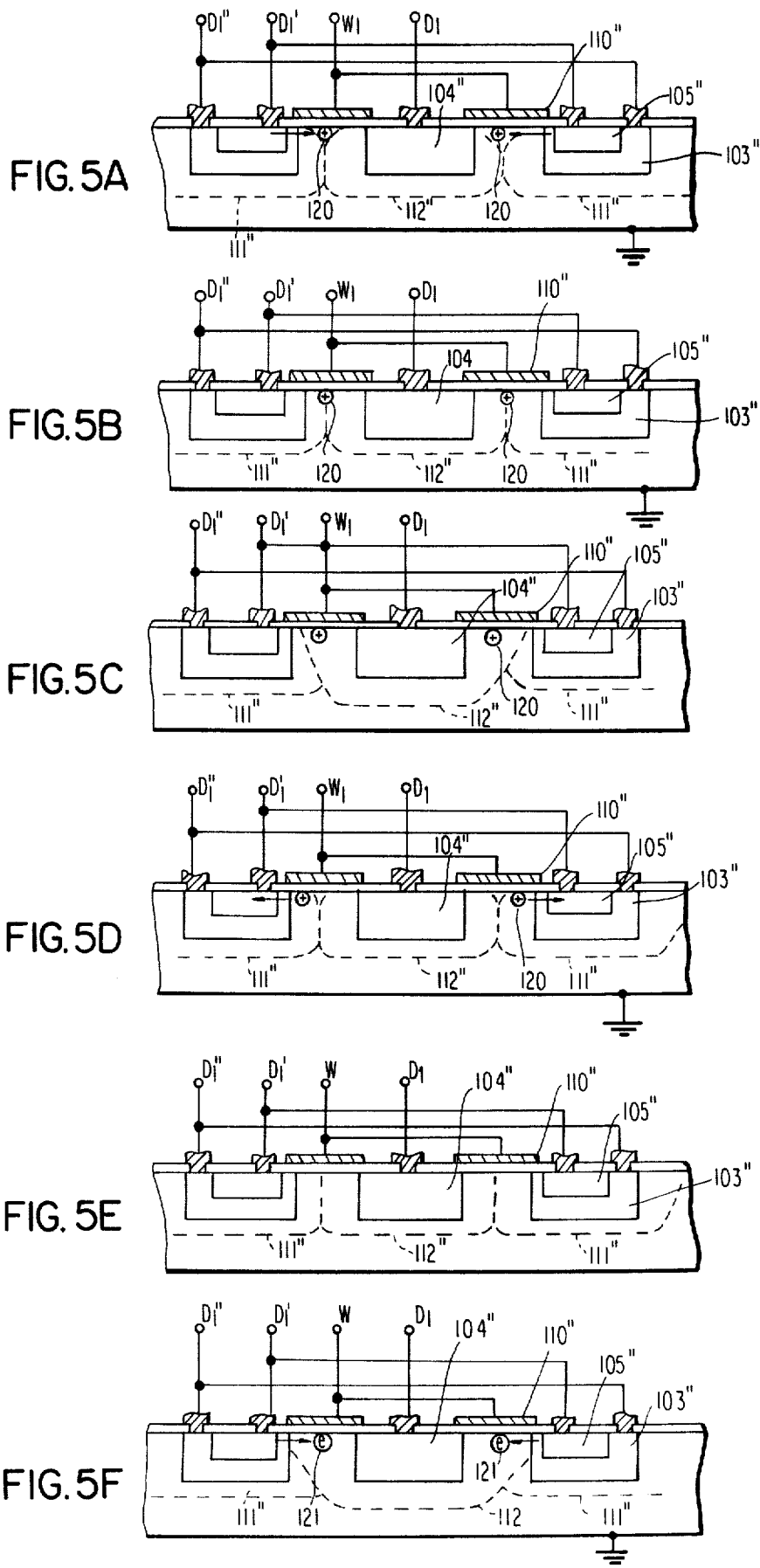
Figure 6:
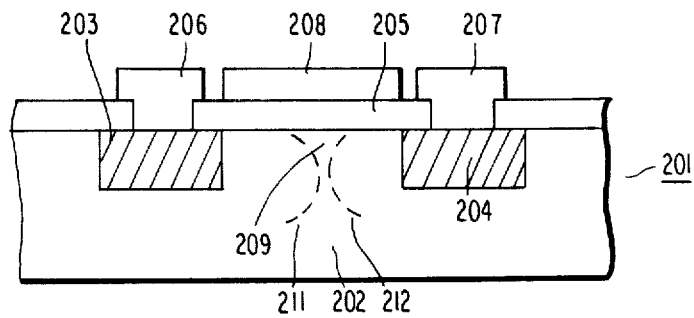
Figure 7:
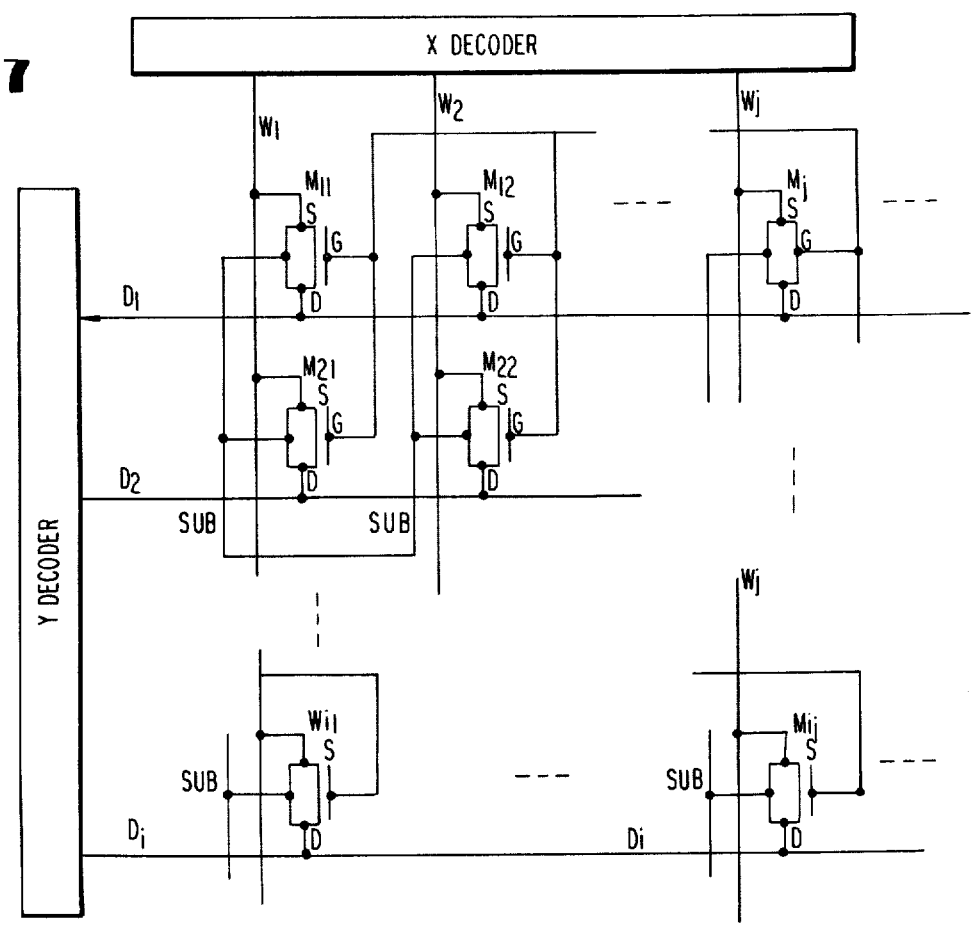
Figure 8:
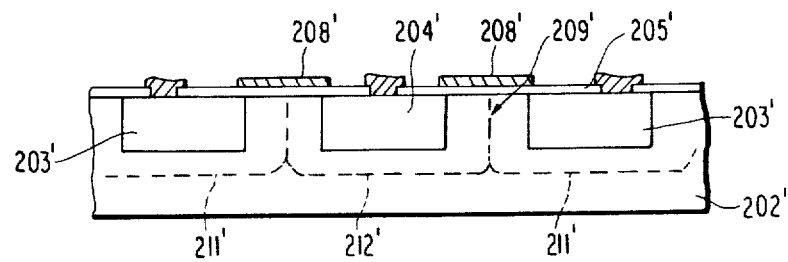
Figure 9A:
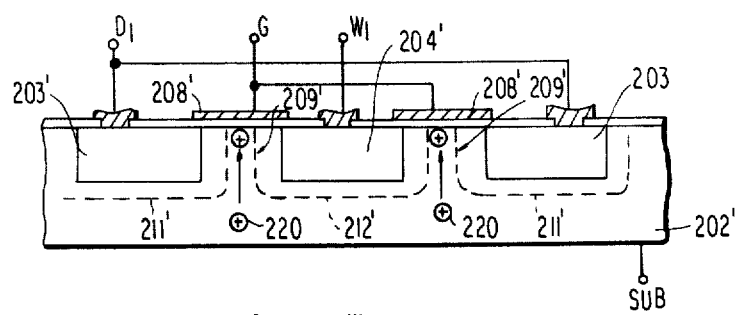
Figure 9B:
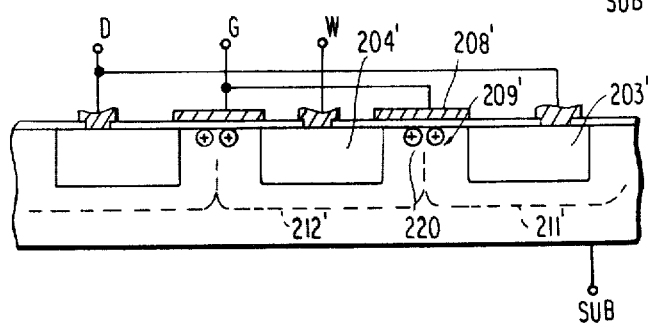
Figure 9C:
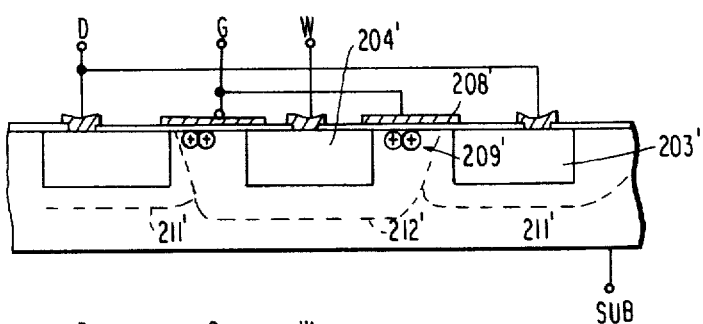
Figure 9D:
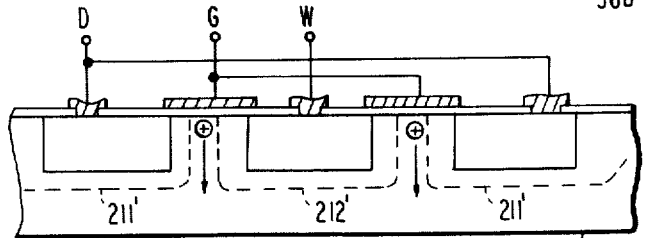
Figure 9E:
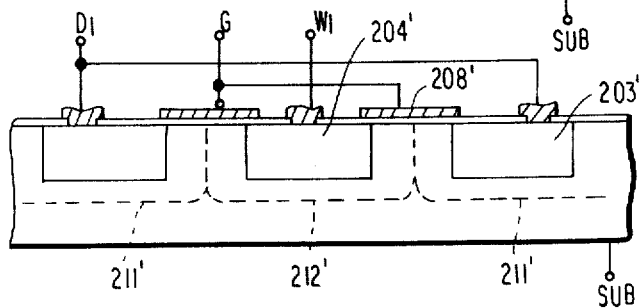
Figure 9F:
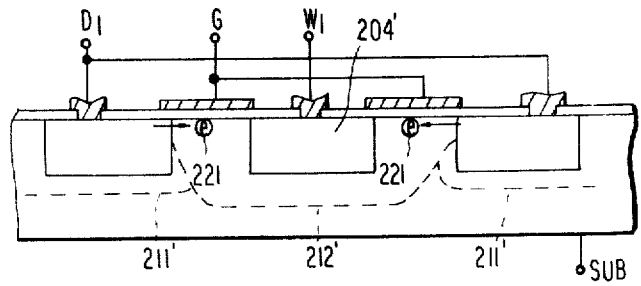
Figure 10:
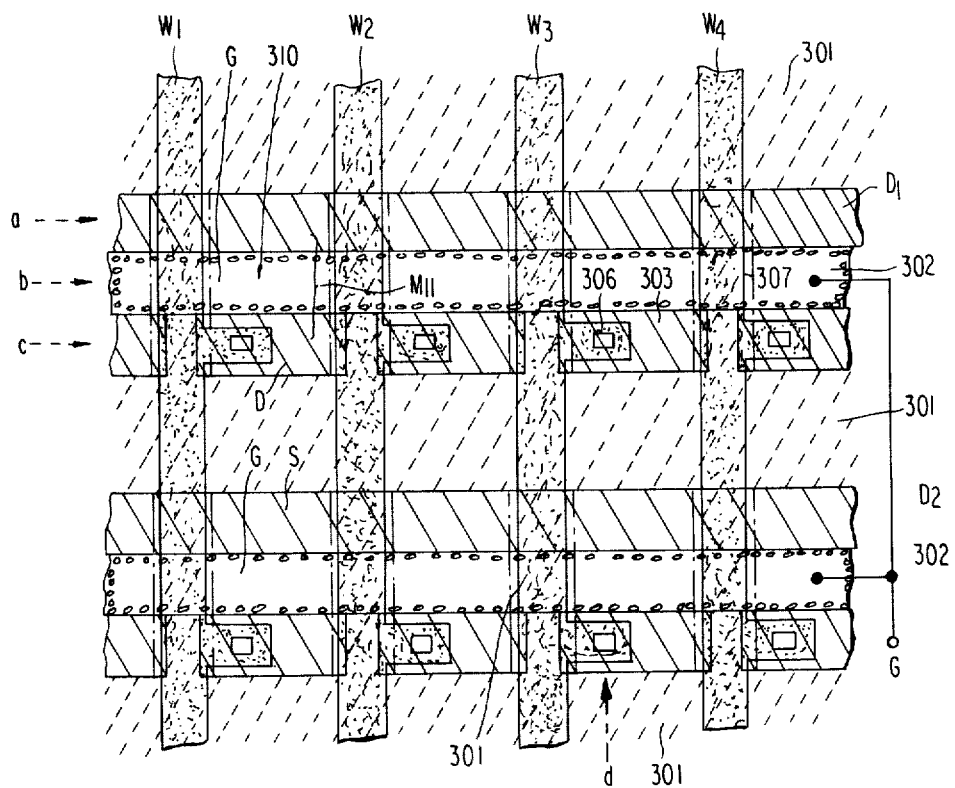

Other features and advantages of the present invention will become apparent from the following description of embodiments, taken in conjunction with the accompanying drawings, wherein:

FIG. 1 is a cross-section view showing a memory cell according to one preferred embodiment of the present invention, FIG. 2 is a cross-sectional view showing a first modification of memory cell in FIG. 1, FIG. 3 is a cross-sectional view showing a second modification of the memory cell in FIG. 1, FIG. 4 is a schematic circuit diagram showing a memory circuit composed of the memory cells illustrated in FIG. 1, FIGS. 5(A) to 5(F) are schematic cross-sectional views to be used for explaining the operation of the memory cell in FIG. 3, FIG. 6 is a cross-sectional view showing a memory cell according to a second preferred embodiment of the present invention, FIG. 7 is a schematic circuit diagram showing a memory circuit composed of the memory cells illustrated in FIG. 6, FIG. 8 is a cross-sectional view showing a modification of the memory cell in FIG. 6, FIGS. 9(A) to 9(F) are schematic cross-sectional views to be used for explaining the operation of the memory cell in FIG. 8, FIG. 10 is a plan view showing one example of the semiconductor integrated circuit memory devices which realizes the memory circuit of FIG. 7, and FIGS. 11A to 11D are cross-sectional views of the integrated circuit memory device of FIG. 10 taken in the positions and directions indicated by arrows a to d in FIG. 10.

Now one preferred embodiment of the present invention will be described with reference to FIG. 1.

The illustrated memory cell has the structure comprising a high-resistance P-type silicon substrate 102, a source 103 and a drain 104 each consisting of a square-shaped N-type layer, a P-type layer 105 formed within the source 103 and deviating towards the drain 104, a gate insulating film 106, a gate electrode 110, and metal electrodes 107, 108, and 109 and connected respectively to the source 103, drain 104, and P-type layer 105. In this example, for the P-type substrate 102 a silicon substrate having an impurity concentration of $3 \times 10^{14}/cm^3$ is employed, and for the gate insulating film 106 a silicon oxide film of 1000 Å in thickness is used. The drain region 103 and source region 104 are formed by selective diffusion or ion implantation of phosphorus, the depth of junction being $2.0\mu$, and the impurity concentration is $10^{19}/cm^3$. The distance between the drain region 103 and the source region 104, that is, the effective channel length is selected to be $3.0\mu$. The P-type layer 105 has an impurity concentration of $10^{21}/cm^3$ and a junction depth of $1\mu$. Under such conditions, a built-in potential $V_{bi}$ at the PN-junctions formed between the drain region 103 and the substrate 102 and between the source region 104 and the substrate 102 is about 0.7 V. Accordingly the width W of depletion layers 111 and 112 produced by this built-in potential $V_{bi}$ is equal to $1.7\mu$, because the width W of the depletion layers 111 and 112 are represented as a function of the built-in potential $V_{bi}$ in the following form:

$$W = \frac{2\epsilon_s V_{bi}}{q N_B}^{\frac{1}{2}}$$

where $N_B$ represents a concentration of a substrate, q a charge of the electron, and $\epsilon_s$ a dielectric constant of silicon. Owing to this internal potential, the depletion layers 111 and 112 can be brought into contact with each other, and a pocket region surrounded by the depletion layers 111 and 112 can be produced in the channel region 113.

In order to use such a MOS transistor structure 101 as a memory cell, it is neccessary to accumulate or deplete positive holes, which are the majority carrier in the substrate 102, in the channel region 113 surrounded by the depletion layer 111 extending from the source 103 and the depletion layer 112 extending from the drain 104. Now for the purpose of accumulating positive holes in the channel region 113, at first a negative potential is applied to the gate electrode 110 to establish the state where the positive holes forming the majority carriers can be captured in the channel region 113 and to raise the potential at the surface 114 of the source 103 located between the P-type impurity layer 105 and the depletion layer 111. When a positive potential is applied to the electrode 109 at the same time, positive holes are injected from the P-type impurity layer 105 into the channel region 113. On the other hand, for the purpose of depleting positive holes in the channel region 113, when the negative potential is applied to the gate electrode 110, a negative potential is applied to the electrode 109 to raise the potential of the source 103 and thereby make the positive holes flow out at the channel region 113 to the P-type region 105. Such states of the channel region 113 where positive holes are accumulated or depleted can be held for several seconds to several tens of seconds due to the fact that the channel region 113 is electrically insulated from the interior of the substrate 102 because it is surrounded by the depletion layers 111 and 112. Accordingly, in order to sustain such states of the channel region 113, it is only necessary to carry out similar writing again, that is, to effect refresh within the holding time.

Whether positive holes are accumulated or depleted in the channel region 113 can be detected by applying a positive voltage to the gate electrode 110 and a fairly large positive voltage to the drain 104. More particularly, since the MOS transistor structure 101 forming the memory cell according to the present invention has such impurity concentration of the substrate 102 and such distance between the source 103 and the drain 104 that the depletion layers 111 and 112 are contiguous to each other under the condition where no voltage is applied to the substrate 102, source 103 and drain 104, when a certain positive voltage is applied to the drain 104 and the gate electrode 110, the depletion layer 112 extending from the drain side further extends largely until it reaches the source 103, and thus the so-called punch-through current flows. This punch-through current is produced by injection of electrons from the source 103, and at a certain positive drain voltage, this electron injection can be made to occur only at the surface portion 115 of the PN-junction between the source 103 and the substrate 102 by applying a positive voltage to the gate electrode 110. When the punch-through occurs only at the surface portion as described above, whether positive holes are accumulated or not in the channel region 113 largely affects the punch-through current flowing between the source 103 and the drain 104, and under the condition where positive holes are not excessively accumulated the punch-through current flows largely, whereas under the condition where positive holes are accumulated the punch-through current is small or the punch-through does not occur. Accordingly, if whether positive holes are accumulated or not in the channel region 113 is made to correspond to the information of "0" or "1", then the detection of the stored information can be effected by means of the source-drain current that is made to flow by the punch-through. The source-drain current can be chosen very large, so that it becomes possible to make the potential on the bit line largely change as compared to the method in which a charge stored in a capacitor is redistributed on a bit line and the potential change on the bit line is observed as is seen in the heretofore known one-transistor dynamic memories.

Therefore, the above-described memory has a great advantage that even if the memory is enlarged to a large-capacity memory and thereby a bit line capacitance is increased, detection of the stored information is made sufficiently possible. Moreover, in the memory cell according to the present invention, since the accumulated carriers are not directly read out but the stored information is detected by the intermediary of the source-drain current modulated by the accumulated carriers, a large capacitor for accumulating the carriers is not necessitated, and therefore, the above-described memory has another advantage that the memory circuit is suitable for a high degree of circuit integration.

In FIG. 2 is illustrated one preferable modification of the memory cell shown in FIG. 1. In this modification, a drain region 104' is formed in a ring shape or in a square frame shape, nearly at the center of the portion of a semiconductor substrate 102' surrounded by the ring-shaped or frame-shaped drain region 104' are formed an island-shaped source region 103' and a P-type impurity layer 105' within the source region 103', and on a ring-shaped or frame-shaped channel region between these drain region 104' and source region 103' is provided a ring-shaped or frame-shaped gate electrode 110'. Since a pocket region surrounded by depletion layers produced such shape of source region 103' and drain region 104' is completely enclosed by the depletion layers, the characteristics of holding the existence state of majority carriers of the pocket region can be improved.

In FIG. 3 is illustrated a second preferable modification of the memory cell shown in FIG. 1. In this modification, a source region 103'' and a P-type impurity layer 105'' are formed in an annular shape so as to surround an island-shaped drain region 104''. In this modification, similarly to the first modification illustrated in FIG. 2, the existence state of majority carriers in the channel region can be better held. Furthermore, since the P-type impurity layer 105'' is also formed in an annular shape, injection of majority carriers from the P-type impurity layer 105'' to the channel region also can be achieved at a high speed.

Now description will be made on a memory composed of the memory cells 101 illustrated in FIG. 1 (or FIG. 2 or 3) with reference to FIG. 4. In this figure, by way of example, a 2×2 matrix construction is illustrated. In FIG. 4, word lines $W_1$ and $W_2$ are connected to gates 110 (110', 110'') of memory cells 101, read digit lines $D_1$ and $D_2$ are connected to drains 104 (104', 104'') of the same, and write digit lines $D_1'$ and $D_2'$ are connected to impurity diffused layers 105 (105', 105'') within sources 103 (103', 103''). Here, substrates 102 of all the cells are grounded in common. The source 103 (103', 103'') is connected to an auxiliary digit line $D_1''$.

Next, the operation of the matrix construction composed of the memory cells shown in FIG. 3 as illustrated in FIG. 4, will be described particularly in connection to one memory cell $M_{11}$, with reference to FIG. 5. Here it is assumed that the impurity concentrations of the respective regions and the substrate and the dimensions of the respective portions fulfil the same conditions as the first preferred embodiment shown in FIG. 1.

At first, the operation upon writing a "0" in the memory cell will be described. At first the word line $W_1$ is held at a negative potential of $-3$ V, and the write digit line $D_1'$ is brought to $+3$ V, while the drain 104'' is held at the ground level. Under such condition, positive holes 120 as the majority carriers are injected from the P-type impurity layer 105'' to the channel region as shown in FIG. 5(A). In this way, the positive holes 120 are accumulated in the channel region at an excessive degree, and thereby writing of the information "0" is effected.

After writing of this information "0", the word line $W_1$, the read digit line $D_1$ and the write digit line $D_1'$ are held at the ground potential, so that the positive holes 120 are retained in the channel region as shown in FIG. 5(B).

Subsequently, when the information "0" stored in this memory cell $M_{11}$ is to be read out, the word line $W_1$ is changed in potential to $+1$ V, and the read digit line $D_1$ is changed in potential to $+3$ V. At this moment, the write digit line $D_1'$ is held grounded. Then, as shown in FIG. 5(C), in this case, the positive holes are excessively present in the channel region, the punch-through current is not provided.

Next, write-read operations of the information "1" will be described. Then the word line $W_1$ is brought to a positive potential of about $-3$ V, while the write digit line $D_1'$ is brought to $-3$ V. At this moment, as shown in FIG. 5(D), the positive holes 120 in the channel region are swept out through the P-type impurity region 105'', so that the channel region takes a depletion state of majority carriers and thereby storage of the information "1" is effected. During this write period, in the other memory cells $M_{12}$, $M_{21}$ and $M_{22}$, the information stored previously therein can be preserved because either the write digit line $D_2'$ is held at the ground level or the word line $W_2$ is held at the ground potential. Subsequently, when the write operation has finished, the applied potential condition is held the same as that in FIG. 5(B), and hence, the information represented by the depletion of the majority carriers is retained as shown in FIG. 5(E). Next, when it is intended to read the information "1" stored in this memory cell $M_{11}$, the read operation is conducted by establishing the same potential condition as that shown in FIG. 5(C), that is, by holding the word line $W_1$ at the $+1$ V level and the read digit line $D_1$ at $+3$ V level. In this case the depletion layer 112" extending from the drain region 104" reaches the source region 103", so that electrons 121 are injected from the source region 103" into the depletion layer 112" and thereby a punch-through current is produced between the source and the drain. Detection of the information "1" stored in this memory cell $M_{11}$ can be effected by sensing this punch-through current which flows through the read digit line $D_1$. In the other memory cells $M_{12}$, $M_{21}$ and $M_{22}$, the previously written information can be preserved, because the read digit line $D_2$ is held at the ground potential or the word line $W_2$ is held at the ground potential. In addition, re-write (refresh) of the information in the memory cell $M_{11}$ is effected only by detecting the read current through the read digit line $D_1$ and writing the signal corresponding to the read current in the same memory cell $M_{11}$.

Now a second preferred embodiment of the present invention will be described with reference to FIG. 6.

While the injection of majority carriers into the channel region was effected by means of the P-type impurity layer 105 (105', 105") in the above-described first preferred embodiment, in the second preferred embodiment modification is made such that the majority carriers are injected from the substrate into the channel region by selectively releasing the enclosure of the channel region by the depletion layers.

Referring to FIG. 6, a MOS memory cell 201 has a MOS transistor structure comprising a P-type silicon substrate 202, an N-type source 203, an N-type drain 204, a gate insulating film 205, a gate 208, and metal wirings 206 and 207. The substrate 202 contains a P-type impurity at a concentration of $3 \times 10^{14}/\text{cm}^3$. The source region 203 and drain region 204 are formed by diffusion or ion implantation of phosphorus, and they have an impurity concentration of $10^{21}/\text{cm}^3$ and a junction depth of $2.0\mu$. The channel length of the channel region 209 between the source region 203 and the drain region 204 is equal to $3.0\mu$, and the gate insulating film is formed of a $S_iO_2$ film of 1000 Å in thickness. While the gate 208 as well as the metal wirings 206 and 207 are made of aluminum, they could be made of any arbitrary wiring material. The depletion layers 211 and 212 formed by the source region 203 and the drain region 204, respectively, are made to have a width of $1.7\mu$ by the built-in potential due to the PN-junctions per se when the respective regions are held at the ground level, and they can isolate the channel region 209 from the substrate 202. In this memory cell 201, when a backward voltage is applied between the source 203 and drain 204 and the substrate 202 or when they are held at an equal potential, that is, a forward voltage is not applied between them, the depletion layers 211 and 212 are extended from the source 203 and drain 204 so that they can be connected at a position under the insulating film 205. Accordingly, the state of the majority carriers in the channel region 209 can be retained. Reading of the stored information can be effected by further extending the depletion layer 212 from the drain 204 until it reaches the source 203 and detecting either existence or non-existence of the punch-through current which corresponds respectively to non-existence or existence of majority carriers in the channel region.

FIG. 7 shows MOS memory device including a memory cell in FIG. 6. In this diagram, gate electrodes (208) and substrate electrodes, respectively, of all the memory cells are respectively connected in common. Digit lines $D_1$, $D_2$, ... are respectively connected to the drain electrodes of the MOS transistors $M_{11}$, $M_{12}$, ..., $M_{21}$, $M_{22}$, ..., ... in the corresponding rows, while word lines $W_1$, $W_2$, ... are respectively connected to the source electrodes of the MOS transistors $M_{11}$, $M_{22}$, ..., ... in the corresponding columns.

In FIG. 8 is illustrated one modification of the memory cell 201 shown in FIG. 7. In this modification a source region 203' is formed in a ring shape. A drain region 204' is formed in a circular shape nearly at the center of the region of the substrate 202' surrounded by the source region 203'. On a channel region 209' between the source region 203' and the drain region 204' is formed a ring-shaped gate electrode 208' via a gate insulating film 205'. In this modified construction, the impurity concentrations in the substrate 202', source region 203' and drain regions 204' are approximately equal to those in the memory cell 201 in FIG. 6. Also the thickness of the gate insulating film is 1000 Å, and the channel length is $3.0\mu$. In this modification, since the majority carriers are preserved while being enclosed in the ring-shaped channel region, the state of the majority carriers can be stably retained for a long period.

Now the operation of the memory cell shown in FIG. 8 will be described with reference to FIG. 9, in connection to the case where the memory cell is applied to the memory device in FIG. 7 as one memory cell $M_{11}$.

At first description will be made on write-hole-read of the information "0". It is to be noted that in the following operation the substrate terminal SUB is always grounded.

Upon writing the information "0" in the memory cell $M_{11}$, the digit line $D_1$, the word line $W_1$ and the gate electrode terminal G are respectively brought to $-3$ V. At this moment, as shown in FIG. 9(A), the depletion layer 211' extending from the source 203' and the depletion layer 212' extending from the drain 204' shrink, so that the isolation between the channel region 209' and the substrate 202' is removed. Then, by the effect of the negative potential at the gate 208', positive holes 220 in the substrate 202' are accumulated in the channel region 209' as shown by arrows. In this way, writing of the information "0" is achieved. During this write operation, in the remaining memory cells other than the memory cell $M_{11}$, since both the word line and digit line are held at the ground potential or either one of the word line and digit line is held at $-3$ V, the overlap between the two depletion layers 211' and 212' cannot be released. Therefore, the state of the majority carriers in the channel region 209' can be retained, that is, the stored information can be preserved.

Subsequently, when the written information "0" is to be held, at first the word line $W_1$ and the digit line $D_1$ are returned to the ground level to again isolate the channel region 209' from the substrate 202' by means of the depletion layers 211' and 212', and thereafter the gate electrode terminal G is returned to the ground level. Thus the accumulated positive holes 220 can be preserved in the channel region 209', as shown in FIG. 9(B).

When the information "0" stored in the memory cell $M_{11}$ is to be read, the word line $W_1$ is brought to $+3$ V, while maintaining the gate electrode terminal G at the ground level (or at a positive potential). Then the digit line $D_1$ is held at the ground level. At this moment, as shown in FIG. 9(C), the depletion layer 212' extending from the drain 204' expands towards the source region 203'. However, since the positive holes are accumulated in the channel region 209' in this case, a punch-through current would not occur, or even if it occurs, the magnitude of the current is very small. This state is detected through the digit line $D_1$ and interpreted that the information "0" has been stored in the memory cell $M_{11}$. Thus reading of the information "0" can be achieved.

Now description will be made on write-hold-read of the information "1". In this case also the substrate terminal is always held at the ground level.

In this case, in response to the information "1" to be stored, the gate electrode terminal G is brought to +3 V which depletes the majority carrier in the channel region 209' while the digit line $D_1$ and the word line $W_1$ are respectively brought to −3 V similarly to the case of writing the information "1". At this moment, similarly to the case shown in FIG. 9(A), the depletion layers 211' and 212' shrink, so that the channel region 209' is coupled to the substrate 202'. However, at this time since the gate potential is a positive potential, the positive holes 220 in the channel region 209' are pushed back to the substrate 202' as shown in FIG. 9(D). Thus the channel region becomes a depletion state of positive holes, and thus writing of the information "1" is effected. During the above-mentioned write operation to the memory cell $M_{11}$, the other memory cells have only one of the source and the drain brought to −3 V or have both the source and the drain held at the ground level. In the former case, one of the depletion layers extending from the source and drain, shrinks. However, with the degeneration of only one depletion layer, the contact between the depletion layers 211' and 212' is still maintained, and hence the channel region 209' cannot be coupled to the substrate 202'. In the memory cell having both the source and the drain held at the ground level, of course, the channel region 209' is kept isolated from the substrate 202'. Therefore, when the information "1" is written in one particular memory cell $M_{11}$, the information stored in the other memory cells can be preserved.

Subsequently, the digit line $D_1$ and the word line $W_1$ are returned to the ground potential to bring the depletion layers 211' and 212' into contact for isolating the channel region 209' from the substrate 202', thereafter the gate electrode terminal G is returned to the ground level. Thus a holding state of the memory cell $M_{11}$ can be established as shown in FIG. 9(E).

When the information "1" stored in the memory cell $M_{11}$ is to be read out, the word line $W_1$ is brought to +3 V while maintaining the gate electrode terminal G and the digit line $D_1$ at the ground level. At this moment, as shown in FIG. 9(F), the depletion layer 212' extending from the drain 204' expands till the source region 203'. Consequently, by injection of electrons 221 from the source 203' to the channel region 209', a punch-through current is produced between the drain 204' and source 203', and hence, reading of the stored information "1" can be achieved by detecting this punch-through current via the digit line $D_1$.

With reference to FIGS. 10 and 11, one example of a semiconductor integrated circuit structure of the memory circuit of FIG. 7 will be described.

Digit lines $D_1$, $D_2$ are made of N-type semiconductor regions elongated in column directions provided in P-type semiconductor substrate 300. These digit lines have their depth of 2 microns as shown in FIG. 11(A). Digit lines $D_1$, $D_2$ also serve as sources (S) of the memory cell such as $M_{11}$. A plurality of N-type regions 303 arranged in the column directions also serve as drains (D) of the memory cells. The N-type regions 303 have the same junction depth as those of digit lines $D_1$, $D_2$. The digit lines and N-type regions are fabricated at the same time by thermal diffusion of impurities or ion-implantation technique. A plurality of thick oxide regions 301 elongated in row and column directions and partially embedded in the surface portion of the substrate 300 are formed by selectively oxidizing the surface of the substrate 300. The thick oxide regions 301 isolate the respective rows of the memory cell matrix in the row directions. The thickness of the thick oxide regions 301 are about 1.5 micron. These thick oxide regions 301 especially surround channel regions 310 with the depletion layers extending from the drain (D) and source (S) so that the channel regions, especially the surface of the channel regions can be perfectly isolated from the substrate both in vertical and lateral directions. Word lines $W_1 \sim W_4$ are made of a highly conductive metal layer such as an aluminum layer elongated in the row directions and disposed on the thick oxide regions 301. These word lines $W_1 \sim W_4$ are connected to the drains (D) i.e. N-type region 303, via contact holes 306 as shown in FIG. 11(C). Gates are made of polycrystalline silicon wiring layers 302 elongated in the column directions in parallel with the digit lines, as shown in FIG. 11(B). The polycrystalline silicon wiring layers have a thickness of about 0.6 micron. The surface of the polycrystalline silicon wiring layers are thermally converted into its oxide to provide an insulator layer 307' for the word lines. The polycrystalline silicon wiring layers 302 are electrically connected in common. The thick oxide region 301 also isolates the column from neighbouring columns as well as the row directions as shown in FIG. 11(D).

In this connection, it may be possible to provide highly doped P-type region 320, i.e. the so-called channel stopper region, under the thick oxide region 301 for further inhibiting leakage between the columns. This channel stopper region is located so as not to electrically contact with the channel regions.

While the present invention has been described above in connection to its preferred embodiments, it is a matter of course that the invention should not be limited only to the illustrated embodiments but it can be realized in various forms under various conditions of an impurity concentration and under various voltage conditions. In addition, while the channel region is isolated from the substrate by the depletion layers produced by the built-in potential in the above-described embodiments, the channel region may be isolated by producing depletion layers by an external electric field.

We claim:

1. A semiconductor memory device comprising a semiconductor substrate of a first conductivity type, first and second semiconductor regions of a second conductivity type provided in said semiconductor substrate, a channel region positioned between said first and second semiconductor regions at the surface of said semiconductor substrate, an insulator film disposed on said channel region, a control electrode disposed on said insulator film, means for generating depletion layers from said first and second semiconductor regions in such a manner that said depletion layers contact with each other to isolate at least a portion of said channel region from said substrate in vertical direction of said semiconductor substrate, means for selectively accumulating majority carriers to said channel region at a density higher than that of said semiconductor substrate, and means for detecting the existence of the accumulation of said majority carriers in said channel region.

2. The device according to claim 1, wherein said detecting means includes means for generating a punch-through current between said first and second semiconductor regions when said accumulation of said majority carriers do not exist in said channel region.

3. The device according to claim 1, wherein said accumulating means includes a third semiconductor region of said first conductivity type formed in one of said first and second semiconductor regions.

4. The device according to claim 1, wherein said accumulating means includes means for operatively separating the contact of said depletion layer so as to feed said majority carriers from said semiconductor substrate to said channel region.

5. A memory device comprising a plurality of memory word lines, a plurality of digit lines, a plurality of memory cells arranged at respective intersections of said word lines and said digit lines, said memory cell including a first semiconductor region of a first conductivity type, second and third semiconductor regions of a second conductivity type provided in said first semiconductor region, said second semiconductor region being connected to associated one of said word lines, said third semiconductor region being associated one of said digit lines, said second and third semiconductor regions defining a channel region therebetween in said first semiconductor region, an insulator film disposed on said channel region, a conductive layer disposed on said insulator film, and first and second depletion layers extending in said first semiconductor region from said second and third semiconductor regions respectively, said first and second depletion layers being normally overlapped with each other, means for operatively supplying selected one of said word line a first potential which shrinks said first depletion layer, means for operatively supplying selected one of said digit lines with a second potential which shrinks said second depletion region, both of shrinkages of said first and second depletion layers deleting the contact of said first and second depletion layers in each of said memory cells, means for supplying said conductive layer with a third potential which induces majority carriers of said first semiconductor region in said channel region, and means for supplying selected one of said word lines with a fourth potential which causes a punch-through current between said second and third semiconductor regions when said majority carriers are not accumulated in said channel region of selected one of said memory cells.

6. The device according to claim 5, wherein said first semiconductor region is common for all of said memory cells.

7. A semiconductor memory device comprising a plurality of word lines, a plurality of read digit lines, a plurality of write digit lines, a plurality of memory cells including a first semiconductor region of a first conductivity type, a second and a third semiconductor regions of a second conductivity type provided in said first semiconductor region, said second and third semiconductor regions defining a channel region therebetween, said second semiconductor region being connected to one of said read digit lines, a fourth semiconductor region of said first conductivity type provided in said third semiconductor region, said fourth semiconductor region being connected to one of said write digit lines, first and second depletion layers extend from said second and third semiconductor regions respectively, said first and second depletion layers being contacted with each other thereby to isolate said channel region from said first region in vertical direction of said first semiconductor region, an insulator film disposed on said channel region, and a control electrode disposed on said insulator film, said control electrode being connected one of said word lines, and means for supplying selected one of read digit lines with a potential which causes a punch-through current between said second and third semiconductor regions when majority carriers of said first semiconductor region are not accumulated in said channel region.

8. A memory comprising a semiconductor substrate of one conductivity type, first and second regions of the opposite conductivity type provided in said semiconductor substrate, a channel region located between said first and second regions, a control electrode provided on said channel region via an insulating film, and means for extending depletion layers from said first and second regions so as to isolate said channel region from said semiconductor substrate, and means for selectively accumulating majority carriers of said semiconductor substrate in said channel region, the existence or nonexistence of accumulation of said majority carriers in said channel region being made to correspond to the stored information.

* * * * *